(12) United States Patent
Wagenaar et al.

(10) Patent No.: US 8,071,950 B2
(45) Date of Patent: Dec. 6, 2011

(54) METHODS AND SYSTEMS OF COMBINING MAGNETIC RESONANCE AND NUCLEAR IMAGING

(75) Inventors: Douglas J. Wagenaar, Westlake Village, CA (US); Bradley E. Patt, Sherman Oaks, CA (US)

(73) Assignee: Gamma Medica-Ideas, Inc., Northridge, CA (US)

( * ) Notice: Subject to any disclaimer, the term of this patent is extended or adjusted under 35 U.S.C. 154(b) by 0 days.

(21) Appl. No.: 12/592,364

(22) Filed: Nov. 23, 2009

(65) Prior Publication Data

US 2010/0072377 A1 Mar. 25, 2010

Related U.S. Application Data

(63) Continuation of application No. 11/985,269, filed on Nov. 13, 2007, now Pat. No. 7,629,586.

(60) Provisional application No. 60/858,773, filed on Nov. 10, 2006.

(51) Int. Cl.
*G21K 1/02* (2006.01)

(52) U.S. Cl. .................................. 250/363.1

(58) Field of Classification Search ............... 250/363.1
See application file for complete search history.

(56) References Cited

U.S. PATENT DOCUMENTS

| | | | |
|---|---|---|---|
| 4,939,464 A | 7/1990 | Hammer | |
| 5,245,191 A | 9/1993 | Barber et al. | |
| 5,691,538 A * | 11/1997 | Ohike et al. | 250/363.05 |
| 6,242,743 B1 * | 6/2001 | DeVito et al. | 250/363.05 |
| 7,629,586 B2 * | 12/2009 | Wagenaar et al. | 250/363.1 |
| 2002/0167317 A1 * | 11/2002 | Shenoy et al. | 324/307 |
| 2003/0090267 A1 | 5/2003 | Rubashov | |
| 2004/0027125 A1 * | 2/2004 | Clarke et al. | 324/308 |
| 2006/0251312 A1 | 11/2006 | Krieg et al. | |
| 2007/0080295 A1 | 4/2007 | Hamill | |
| 2008/0312526 A1 * | 12/2008 | Gagnon et al. | 600/411 |

FOREIGN PATENT DOCUMENTS

WO WO2006/119085 A2 11/2006

OTHER PUBLICATIONS

Rowe et al. A stationary hemispherical SPECT imager for three-dimensional brain imaging, The Journal of Nuclear Medicine, vol. 34, No. 3 (Mar. 1993), pp. 474-480.*

Renker, Photosensors, Nuclear Instruments and Methods in Physics Research A, vol. 527, No. 1-2 (Jul. 2004), pp. 15-20.*

(Continued)

*Primary Examiner* — David Porta
*Assistant Examiner* — Casey Bryant
(74) *Attorney, Agent, or Firm* — Christie, Parker & Hale, LLP

(57) ABSTRACT

A multi-modality imaging system for imaging of an object under study, e.g., a whole body or parts of the body of animals such as humans, other primates, swine, dogs, rodents (especially mice and rats), that includes a magnetic resonance imaging apparatus and a cadmium zinc telluride (CZT)-family semiconductor, single-photon imaging apparatus in close proximity such that sequential or simultaneous imaging can be done with the two modalities using the same support bed of the object under study in the same, uninterrupted imaging session.

19 Claims, 18 Drawing Sheets
(8 of 18 Drawing Sheet(s) Filed in Color)

OTHER PUBLICATIONS

Farrell, et al. *Advances in semiconductor photodetectors for scintillators*, Nuclear Instructs and Methods in Physics Research A387 (1997), pp. 194-198.

Office Action dated for Oct. 9, 2008, for related U.S. Appl. No. 11/985,269, 15 pages.

Office Action dated May 14, 2009, for related U.S. Appl. No. 11/985,269, 21 pages.

Notice of Allowance dated Sep. 28, 2009, for related U.S. Appl. No. 11/985,269, 8 pages.

* cited by examiner

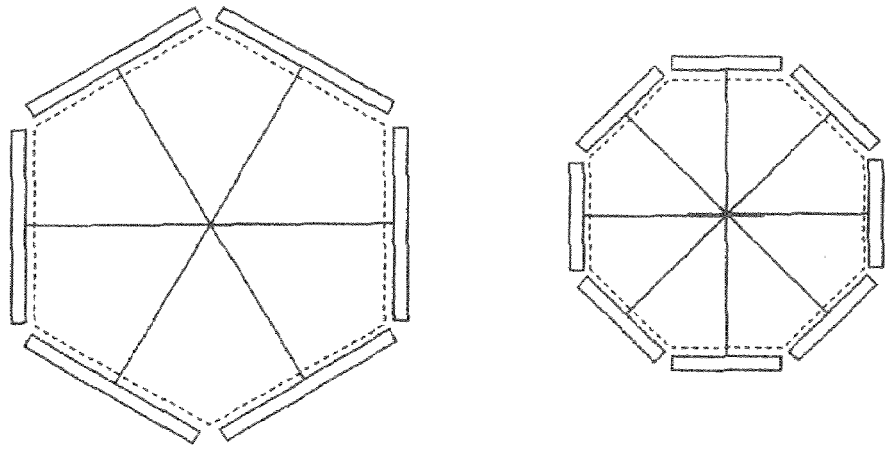
M = 3, 4, 5, 6, and 8
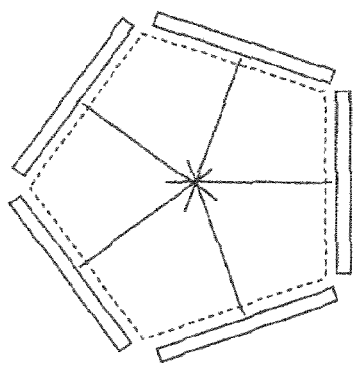
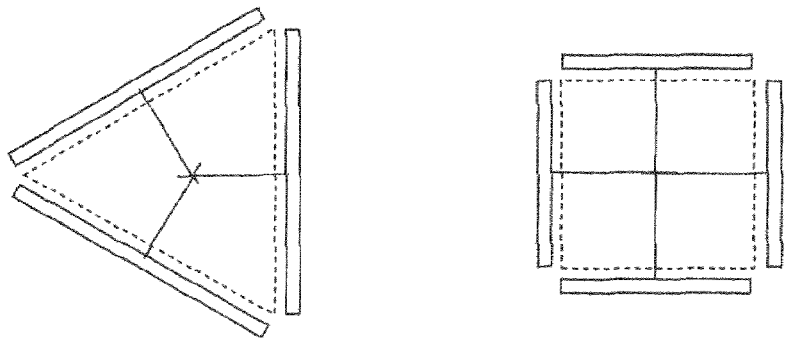
FIG. 4

FIG. 15

| MAGNETIC RESONANCE IMAGING | NUCLEAR IMAGING | | |
|---|---|---|---|
| | HIGH RESOLUTION LOW CONTRAST | | ANATOMICAL |
| | LOW RESOLUTION HIGH CONTRAST | | |
| | VENTILATION | | |
| | VESSEL FLOW | | |
| | PERFUSION | | FUNCTIONAL |
| | DRAINAGE | | |
| | DIFFUSION | | |
| | OXYGENATION | | |
| | METABOLISM | | |
| | PROLIFERATION | | |
| | CELL ACTION (WBC) | | |
| | CELL ACTION (STEM) | | |
| | NANOPARTICLES | | MOLECULAR |
| | ANTIBODIES | | |
| | RECEPTOR DENSITY | | |
| | CYTOKINES | | |
| | REPORTER GENES | | |

METHODS AND SYSTEMS OF COMBINING MAGNETIC RESONANCE AND NUCLEAR IMAGING

CROSS-REFERENCE TO RELATED APPLICATION

The present application is a continuation of U.S. application Ser. No. 11/985,269, filed Nov. 13, 2007, now U.S. Pat. No. 7,629,586 now U.S. Publication No. 2008-0111082 dated May 15, 2008, which Claims priority to and the benefit of U.S. Provisional Application No. 60/858,773 filed Nov. 10, 2006. The entire content of each of the above-referenced applications are incorporated herein by reference.

FIELD OF THE INVENTION

The invention relates generally to multi-modality medical imaging. More particularly, the invention relates to methods and systems for combining magnetic resonance imaging (MRI) with single photon nuclear imaging, such as single photon emission computed tomography (SPECT).

BACKGROUND OF THE INVENTION

Magnetic resonance imaging is an imaging technique used to visualize the inside of an object (or subject) under study (e.g., a human or animal body or a body part or an entire laboratory animal or specimen from the animal or a plastic test phantom). MRI relies on the relaxation properties of excited hydrogen nuclei in water and fat. When the object to be imaged is placed in a powerful, uniform magnetic field, the spins of the atomic nuclei with non-zero spin numbers (essentially, an unpaired proton or neutron) within the tissue all align in one of two opposite directions: parallel to the magnetic field or antiparallel. Magnetic field strengths for MRI studies of animals typically require 4.7 T, and magnets up to 17 T have been reported. For a comparison, the average magnetic field of the Earth is around 50 µT (or 0.5 G).

Single photon emission computed tomography (SPECT) is a nuclear medicine tomographic imaging technique using gamma-rays. Conventionally, this imaging technique accumulates counts of gamma photons that are absorbed by a scintillator crystal. The crystal scintillates in response to interaction with gamma radiation to produce a flash of light. Photomultiplier tubes (PMTs) behind the scintillator crystal detect the flashes of light and a computer sums the fluorescent counts. The sum of fluorescent counts is a measure of the energy of an individual detected gamma-ray, and the location of the detected gamma-ray is computed from the distribution of the fluorescent counts among several PMTs. The computer in turn constructs an image of the relative spatial density of gamma-ray counts, accumulated as a series of detected gamma-rays whose measured energy is within a range that is selected by the operator, and displays the image on a computer monitor. This image then reflects the distribution and relative concentration of radioactive tracer elements present in the organs and tissues imaged.

Although there may be benefits to combine SPECT and MRI, any theoretical benefits of trying to combine SPECT and MRI within a single system have been mostly dismissed because the functions of the PMTs in a typical SPECT system are severely compromised by the high magnetic fields needed for MRI and because magnetic field uniformity needed for MRI is distorted by the PMTs (i.e., the ferro-magnets in the PMTs).

Recent advances in semiconductor technology have opened the possibility of replacing the PMTs and the scintillator crystal of a SPECT system with a semiconductor detector, such as a cadmium zinc telluride (CdZnTe or CZT) detector. The CZT detector may operate in the magnetic field inside an MR imaging apparatus. The CZT detector is referred to as a direct detector of radiation and operates by producing negative and positive charges (or electrons and holes) through interaction with gamma photons. However, combining a CZT detector for detecting gamma photons is still not a trivial task because the electrons and holes of the CZT detector need to travel non-negligible distances to generate their signals (e.g., travel distances of 2-5 mm and even larger). This presents possible Lorentz-force effects where signal generation may be distorted.

In addition, it may be necessary to remove the electronics for signal amplification, address generation, logical operations, and other processing functions from the CZT module (in the high magnetic field) and to bring these electronics to a more distant location (in which a lower field can be found), thereby removing a cause of interference (e.g., either the offending electronics does not function in the high field or the offending electronics causes the MRI to have artifacts). However, the electronics located away from the magnetic field need to be connected via relatively long cables that result in an increased signal noise and distortion.

In view of the foregoing and as discussed in Wagenaar et al. "Rational for the Combination of Nuclear Medicine with Magnetic Resonance for Pre-clinical Imaging," Technology in Cancer Research and Treatment, ISSN 1533-0346, 2006, Vol. 5, No. 4, pp. 343-350, which is incorporated by reference herein in its entirety, it would be desirable to combine MRI with single photon nuclear imaging, such as SPECT, to provide a more complete coverage between high resolution, anatomical imaging, and genetically targeted molecular imaging that overcomes the detrimental effect of the magnetic fields produced by the MRI.

The above information disclosed in this Background section is only for enhancement of understanding of the background of the invention and therefore it may contain information that does not form the prior art that is already known in this country to a person of ordinary skill in the art.

SUMMARY OF THE INVENTION

An aspect of the present invention provides a dual-modality, fused image dataset from MRI and single-photon nuclear medicine imaging modalities in a single imaging session. The single imaging session allows a body (e.g., a human or animal body) or other object being scanned to remain motionless for sequential scanning while using the same body position on the same bed, thereby minimizing mis-registration artifacts from changes in body orientation between imaging studies. The single session also allows the simultaneous operation of the two modalities, providing exact co-registration in both position as well as in time. The ability to perform fused dual-modality imaging is helpful in both clinical imaging as well as pre-clinical research studies involving humans or laboratory animals for the development of drugs and therapies or the general study of biological processes.

A combined magnetic resonance and single photon nuclear imaging system according to an embodiment of the present invention includes at least one semiconductor detector, at least one collimator, at least one magnet, and at least one transceiver. The least one semiconductor detector is for detecting gamma photons. The at least one collimator is for single photon nuclear imaging of an object under study with the at least one semiconductor detector. The at least one magnet is for producing a magnetic field suitable for magnetic resonance imaging. The at least one transceiver is for magnetic resonance imaging the object under study with the at least one magnet. Here, the at least one semiconductor detector is configured to single photon nuclear image the object under study under an influence of the magnetic field suitable for magnetic resonance imaging.

In one embodiment of the system, the at least one semiconductor detector includes a material selected from the group consisting of silicon (Si), germanium (Ge), cadmium telluride (CdTe), mercuric iodide ($HgI_2$), thallium bromide (TlBr), gallium arsenide (GaAs), cadmium zinc telluride (CdZnTe), and cadmium manganese telluride (CdMnTe).

In one embodiment of the system, the at least one semiconductor detector is a cadmium zinc telluride (CZT) detector.

In one embodiment of the system, the at least one semiconductor detector includes at least one semiconductor substrate and a plurality of electrodes. The at least one semiconductor substrate is for producing charge carriers through interaction with gamma photons, and the plurality of electrodes is for collecting the charge carriers to determine the gamma-ray energy and for localizing the gamma-ray interaction.

In one embodiment of the system, the at least one semiconductor detector includes a semiconductor detector ring. The semiconductor detector ring may include a plurality of semiconductor linear sides. Each of the plurality of semiconductor linear sides may include a plurality of semiconductor modules. The semiconductor detector ring may include a plurality of semiconductor module rings. The plurality of semiconductor module rings may include a first ring having a plurality of first modules and a second ring having a plurality of second modules. The first modules of the first ring may be aligned with the second modules of the second ring along an axial direction, or the first modules of the first ring may have an angular offset with the second modules of the second ring along an axial direction.

In one embodiment of the system, the at least one collimator is configured to be positioned between the object under study and the at least one semiconductor detector.

In one embodiment of the system, the at least one semiconductor detector is a stationary detector.

In one embodiment of the system, the at least one magnet includes a central opening, and the at least one semiconductor is configured to single photon nuclear image the body at either end of the at least one magnet and outside the central opening of the at least one magnet such that the object under study is single photon nuclear imaged and magnet resonance imaged in a sequential manner.

In one embodiment of the system, the at least one magnet includes a central opening, and the at least one semiconductor is configured to single photon nuclear image the object under study within the central opening such that the object under study is capable of being single photo imaged and magnet resonance imaged in a substantially simultaneous manner.

In one embodiment of the system, the imaging system further includes a gradient coil attached to the at least one magnet. The at least one magnet may include a central opening, the at least one transceiver includes a radio frequency (RF) coil, and the at least one semiconductor is configured to be between the RF coil and the gradient coil. In addition, the at least one semiconductor may be attached to the gradient coil, or the at least one collimator may be attached to the RF coil.

In one embodiment of the system, the imaging system further includes a correction processor, the at least one semiconductor detector includes at least one semiconductor substrate for producing electrons upon an interaction with gamma photons, and the correction processor is adapted to compensate for a Lorentz-force effect on the electrons traveling within the at least one semiconductor substrate and under the influence of the magnetic field suitable for magnetic resonance imaging such that a drift of the electrons is compensated.

In one embodiment of the system, the at least one semiconductor detector is adapted to detect at least one of the gamma photons emitted by the object under study and to generate a direct detection signal in response, a signal processor is adapted to receive the detection signal and includes a plurality of electronics adapted to amplify, address, and process the detection signal, and the signal processor is positioned away from the magnetic field suitable for magnetic resonance imaging to remove an interference effect of the magnetic field suitable for magnetic resonance imaging.

In another embodiment of the present invention, a method of combining magnetic resonance and single photon nuclear imaging is provided. The method includes: injecting a radioactive isotope into an object under study; detecting gamma photons from the radioactive isotope within the object under study by at least one semiconductor detector; single photon nuclear imaging the object under study with at least one collimator positioned between the object under study and the at least one semiconductor detector; producing a magnetic field suitable for magnetic resonance imaging by at least one magnet; and magnetic resonance imaging the object under study with at least one transceiver positioned between the object under study and the at least one magnet. Here, the object under study is single photon nuclear imaged under an influence of the magnetic field suitable for magnetic resonance imaging.

In one embodiment of the method, the step of detecting the gamma photons further includes: interacting the gamma photons with at least one semiconductor substrate of the at least one semiconductor detector; and collecting charge carriers produced by the interaction of the gamma photons with the at least one semiconductor substrate.

In one embodiment of the method, the at least one semiconductor detector includes a first modular ring having a plurality of first modules and a second modular ring having a plurality of second modules. Here, the object under study may be single photon nuclear imaged by aligning the first modules of the first modular ring with the second modules of the second modular ring along an axial direction. Alternatively, the object under study may be single photon nuclear imaged by angular offsetting the first modules of the first modular ring with the second modules of the second modular ring along an axial direction.

In one embodiment of the method, the object under study is single photon nuclear imaged by not moving the at least one semiconductor detector.

In one embodiment of the method, the at least one magnet includes a central opening, and the object under study is single photon nuclear imaged by the at least one semiconductor at either end of the at least one magnet and outside the central opening of the at least one magnet such that the object under study is single photon nuclear imaged and magnet resonance imaged in a sequential manner.

In one embodiment of the method, the at least one magnet includes a central opening, and the object under study is single photon nuclear imaged by the at least one semiconductor within the central opening such that the object under study is capable of being single photon imaged and magnet resonance imaged in a substantially simultaneous manner.

In one embodiment, the method further includes the step of correcting for a Lorentz-force effect on electrons traveling within at least one semiconductor substrate of the at least one semiconductor detector and under the influence of the magnetic field suitable for magnetic resonance imaging.

In one embodiment, the method further includes the steps of generating at least one direct detection signal in response to detecting the gamma photons by the at least one semiconductor detector; and receiving the detection signal by a signal processor having a plurality of electronics adapted to amplify, address, and process the detection signal; and removing an interference effect of the magnetic filed suitable for magnetic resonance imaging on the single photon nuclear imaging by positioning the signal processor away from the magnetic field suitable for magnetic resonance imaging.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, together with the specification, illustrate exemplary embodiments of the present invention, and, together with the description, serve to explain the principles of the present invention.

FIGS. 4 and 5 depict semiconductor detectors having semiconductor detector rings in accordance with embodiments of the present invention.

FIG. 15 illustrates a complementary relationship between MRI and nuclear imaging, such as SPECT, pursuant to aspects of the present invention.

DETAILED DESCRIPTION

Figure 1:
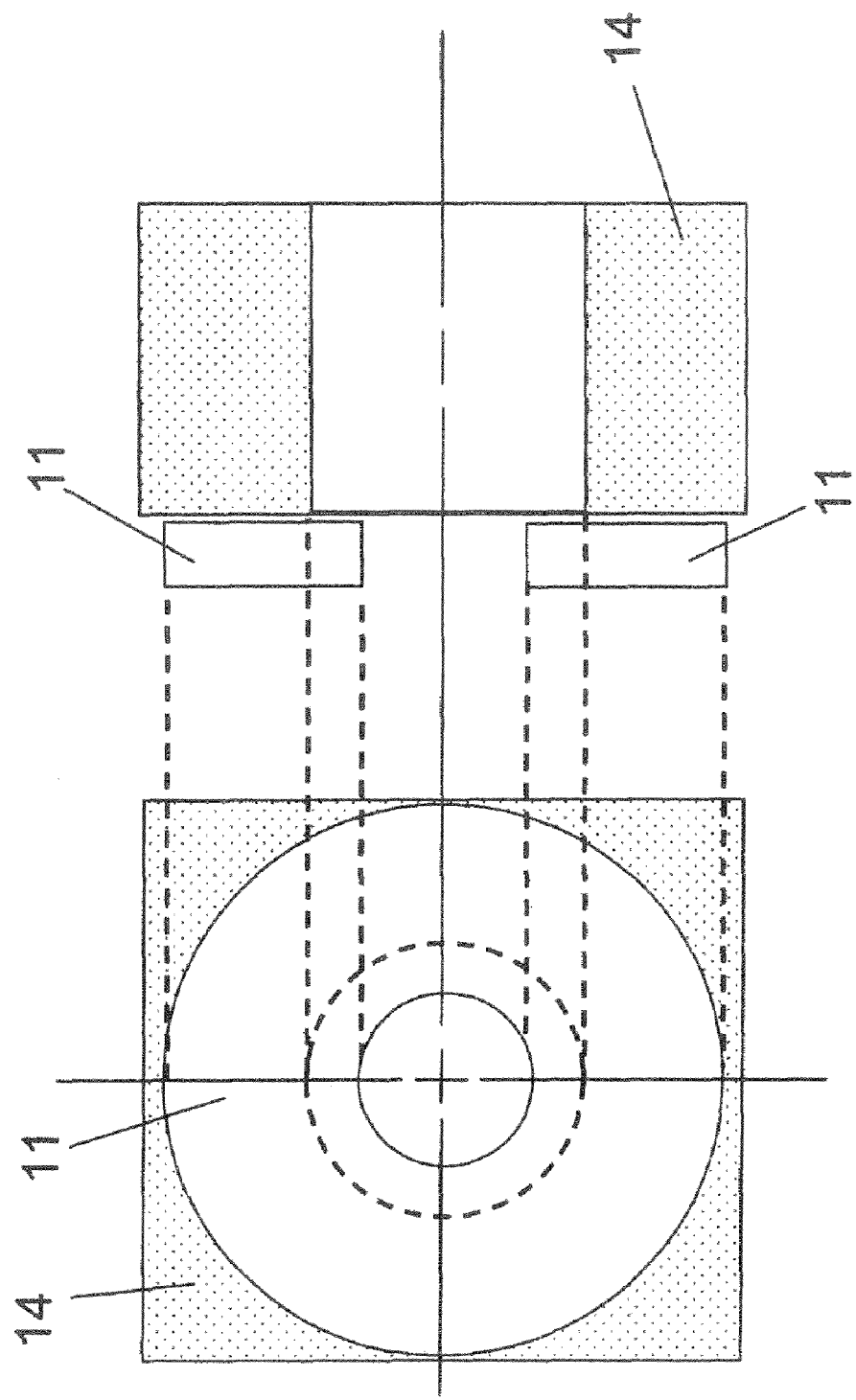
FIG. 1 illustrates a configuration of a combined magnetic resonance and single photon nuclear imaging system according to an embodiment of the present invention.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

An embodiment of the present invention is designed to enhance the MRI imaging by incorporating an additional modality in the same gantry as operated by an MRI machine. The added modality is SPECT, limited-angle SPECT, or planar imaging based on the single photon emission principle.

In one embodiment of the present invention, the single photon emission imagers are based on a semiconductor direct conversion detector, such as a cadmium zinc telluride (CZT) detector. The embodiment of the present invention reduces the possibility of operational mistakes. The embodiment avoids the changing of the position of the human or animal being imaged, and ensures the accuracy of the co-registration between the data acquired from the two modalities. It allows for the simultaneous acquisition of dynamic and/or static data sets and the single-injection of combined contrast agents for the two modalities. Moreover the single photon imager data are not detrimentally affected by the magnetic fields produced by the MRI scanner (or imager) and vice versa.

In more detail, conventional nuclear medicine imaging relies on the use of PMTs to detect light flashes from the absorption of gamma-rays in scintillator crystals. As discussed above, the PMTs, however, do not work in magnetic fields. In one embodiment of the present invention, by replacing the scintillator and PMT combination with a solid-state semiconductor detector, such as a CdZnTe or CZT detector, the embodiment of the present invention realizes a gamma camera that can operate in the magnetic field inside an MR imaging apparatus.

Multimodality imaging offers many opportunities for the combination of spatially and temporally-registered data. One embodiment of the present invention combines anatomical context and functional information, such as the anatomical delineation of the boundaries of a tumor (using, e.g., MRI)

with the functional definition of aggressive cancer cells at the perimeter and necrotic cells at the core of the tumor (using, e.g., SPECT). This is but one of many possible combinations of imaging data, and the present invention is not thereby limited. In one embodiment of the present invention, the combination of MRI data with single-photon nuclear imaging data with spatial and temporal registration is realized through the use of the semiconductor nature of the CZT in order to overcome the magnetic field limitations of conventional PMTs (i.e., since this combination has been technologically precluded by the requirement of PMTs).

Multi-modality imaging should not require a movement over a considerable distance of the object under study (e.g., the human or animal body being imaged), such that a single photon nuclear imaging device (e.g., a PMT detector) is at a considerable distance away from the presence of the magnetic field. That is, moving the animal or patient greatly increases the problem of co-registration of images from the two modalities. Also co-registered images may lose some of their precision if organs or body parts are located at different positions (i.e., they have shifted) during the imaging sessions. As such, one embodiment of the present invention includes a semiconductor CZT detector that can simultaneously or sequentially (in close proximity) provide single photon nuclear imaging (e.g., SPECT) and MRI imaging because the semiconductor CZT imaging detector can operate in a magnetic field, whereas the PMT-based imaging devices cannot create useful images in a magnetic field. That is, simultaneous imaging is possible because the single photon nuclear imaging (or SPECT) system of an embodiment of the present invention is located inside the field of the MRI system.

Figure 19:
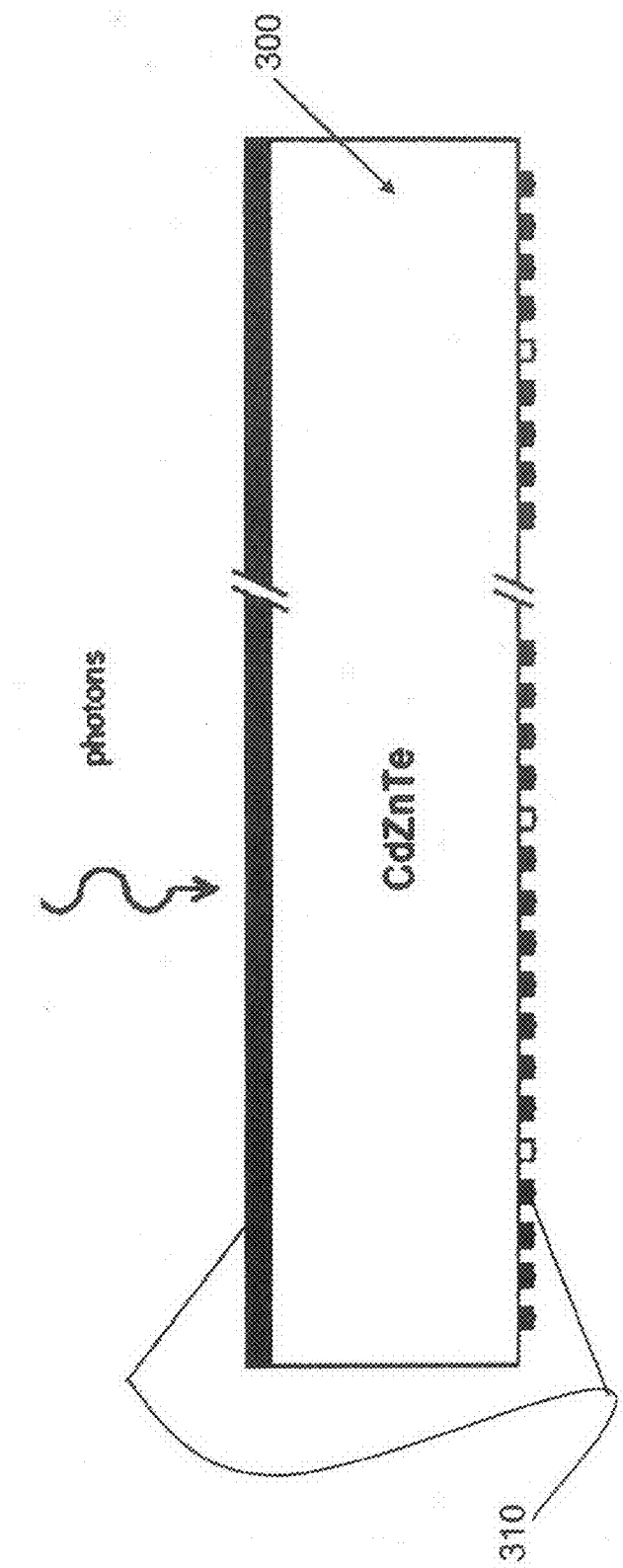
FIG. 19 illustrates a semiconductor detector having a semiconductor substrate (or crystal) for producing charge carriers (electrons or holes) through interaction with gamma photons and electrodes (e.g., anodes or cathodes) for collecting the charge carriers.

Referring to FIG. 19, a semiconductor detector according to an embodiment of the present invention includes a semiconductor substrate (or crystal) 300 for producing charge carriers (electrons or holes) through interaction with gamma photons and electrodes (e.g., anodes or cathodes) 310 for collecting the charge carriers. In FIG. 19, the substrate 300 is made mainly of CZT. However, the present invention is not thereby limited, and a substrate of a semiconductor radiation detector can be made mainly of another compound semiconductor such as silicon (Si), germanium (Ge), cadmium telluride (CdTe), mercuric iodide ($HgI_2$), thallium bromide (TlBr), gallium arsenide (GaAs), and cadmium manganese telluride (CdMnTe).

The principle of operation of a semiconductor detector is the following: if a photon interacts within the detector, all or part of its energy is converted into the liberation of free electrons and holes, the number of electron-hole pairs being proportional to the photon energy converted in the interaction. An externally applied electric field separates the pairs before they recombine; electrons drift toward the anodes, which define the detector's pixels, holes to the cathode; the charge is collected by the electrodes (charge collection) 310. The collected charge produces a current pulse on the electrode 310, whose integral equals the total charge generated by the incident particle, i.e., is a measure of the deposited energy. The readout goes through a charge-sensitive preamplifier, followed by a shaping amplifier.

One embodiment of the present invention includes pixellated semiconductor imaging modules made of CZT. However, the semiconductor imaging module does not necessarily have to be CZT, and it can be another compound semiconductor such as silicon (Si), germanium (Ge), cadmium telluride (CdTe), mercuric iodide ($HgI_2$), thallium bromide (TlBr), gallium arsenide (GaAs), and cadmium manganese telluride (CdMnTe). In one embodiment, these modules are square and planar and can be tiled to form a line (i.e., a ladder) or a rectangular mosaic of modules. The semiconductor does not generally interrupt the operation of the MRI components, and the strong magnetic field does not generally disturb the functionality of the semiconductor detector. Having both modalities capable of simultaneous or adjacent and sequential imaging can thus be realized.

In order to perform tomographic imaging, the semiconductor modules have to sufficiently sample in the angular direction. A ring of the modules is the most straightforward way to provide complete angular sampling for tomography, and FIGS. 1 through 10 depict various ring configurations pursuant to embodiments of the present invention.

In more detail, FIG. 1 depicts a configuration of a combined magnetic resonance and single photon nuclear imaging system according to an embodiment of the present invention. As shown in FIG. 1, the imaging system includes a semiconductor detector 11 for detecting gamma photons and a collimator (described in more detail below) for single photon nuclear imaging of an object (or subject) under study (e.g., a human or animal body) with the semiconductor detector 11. In addition, the imaging system includes a magnet 14 for producing a magnetic field suitable for magnetic resonance imaging and a transceiver for magnetic resonance imaging of the object under study with the magnet 14. Here, the semiconductor detector 11 is configured to single photon nuclear image the object under study being imaged under the magnetic field suitable for magnetic resonance imaging.

In FIG. 1, an "adjacent" configuration in which the semiconductor detector 11 is a CZT ring or a ring of semiconductor detectors (e.g., a SPECT ring) attached to the outside surface of the magnet 14 is shown. The patient (or animal or other object) is sequentially imaged, in the CZT ring of the semiconductor detector 11 first and then magnetic resonance imaged by the magnet 14, or vice-versa, with the patient (or animal or other object) on the same bed in different axial positions such that the animal is sequentially in the fields-of-view of the two respective instruments.

Figure 2:
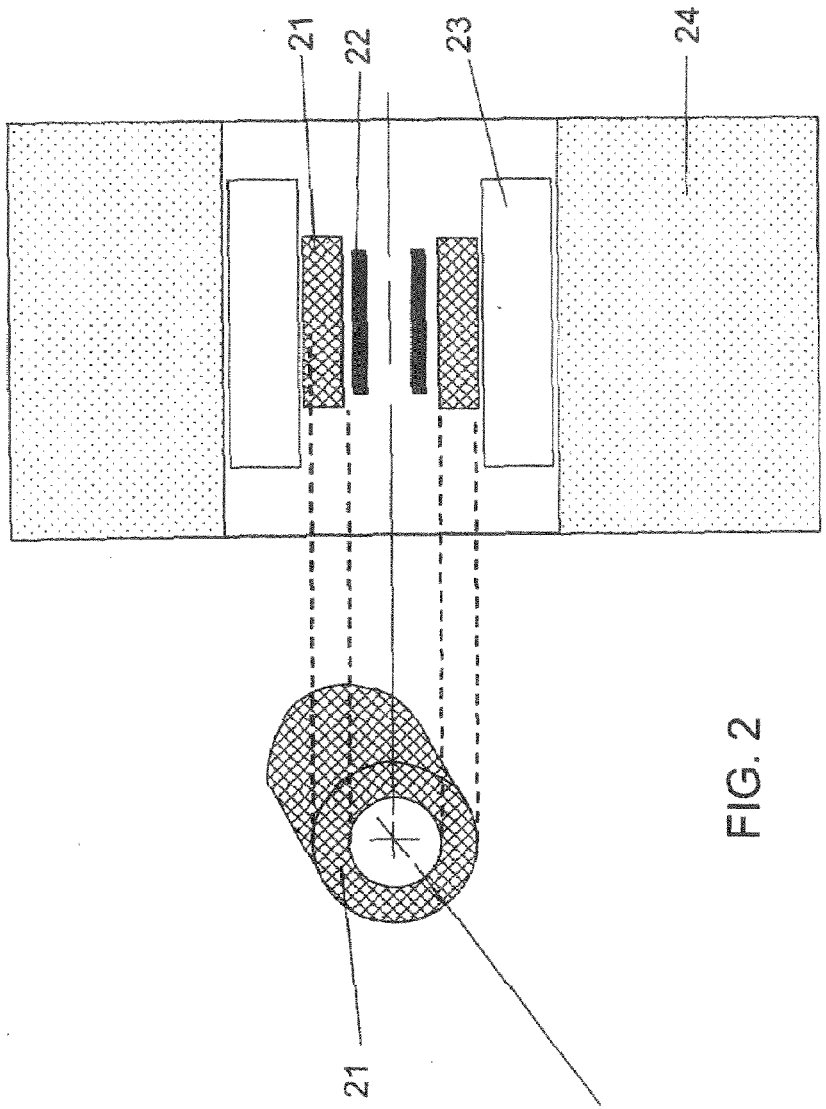
FIG. 2 illustrates another configuration of a combined magnetic resonance and single photon nuclear imaging system according to an embodiment of the present invention.

FIG. 2 depicts another configuration of a combined magnetic resonance and single photon nuclear imaging system according to an embodiment of the present invention. In FIG. 2, the imaging system includes a semiconductor detector 21 for detecting gamma photons and a collimator for single photon nuclear imaging an object under study with the semiconductor detector 21. In addition, the imaging system includes a magnet 24 for producing a magnetic field suitable for magnetic resonance imaging and a transceiver 22 for magnetic resonance imaging the object under study with the magnets 24. Here, the semiconductor detector 21 is configured to single photon nuclear image the object under study under the magnetic field suitable for magnetic resonance imaging.

In more detail, the semiconductor detector 21 is illustrated as a CZT ring attached to a gradient coil 23. The gradient coil 23 is attached to the magnet 24 and is seldom removed from the magnet 24. As such, the CZT ring of the semiconductor detector 21 is also seldom removed from the magnet 24 (i.e., the CZT ring is semi-permanent like the gradient coil 23). Here, the operation of the CZT and the MRI can be simultaneous or sequential, with simultaneous acquisition having certain advantages, as discussed in Wagenaar et al. "Rational for the Combination of Nuclear Medicine with Magnetic Resonance for Pre-clinical Imaging," Technology in Cancer Research and Treatment, ISSN 1533-0346, 2006, Vol. 5, No. 4, pp. 343-350, which is incorporated by reference herein in its entirety.

Figure 3:
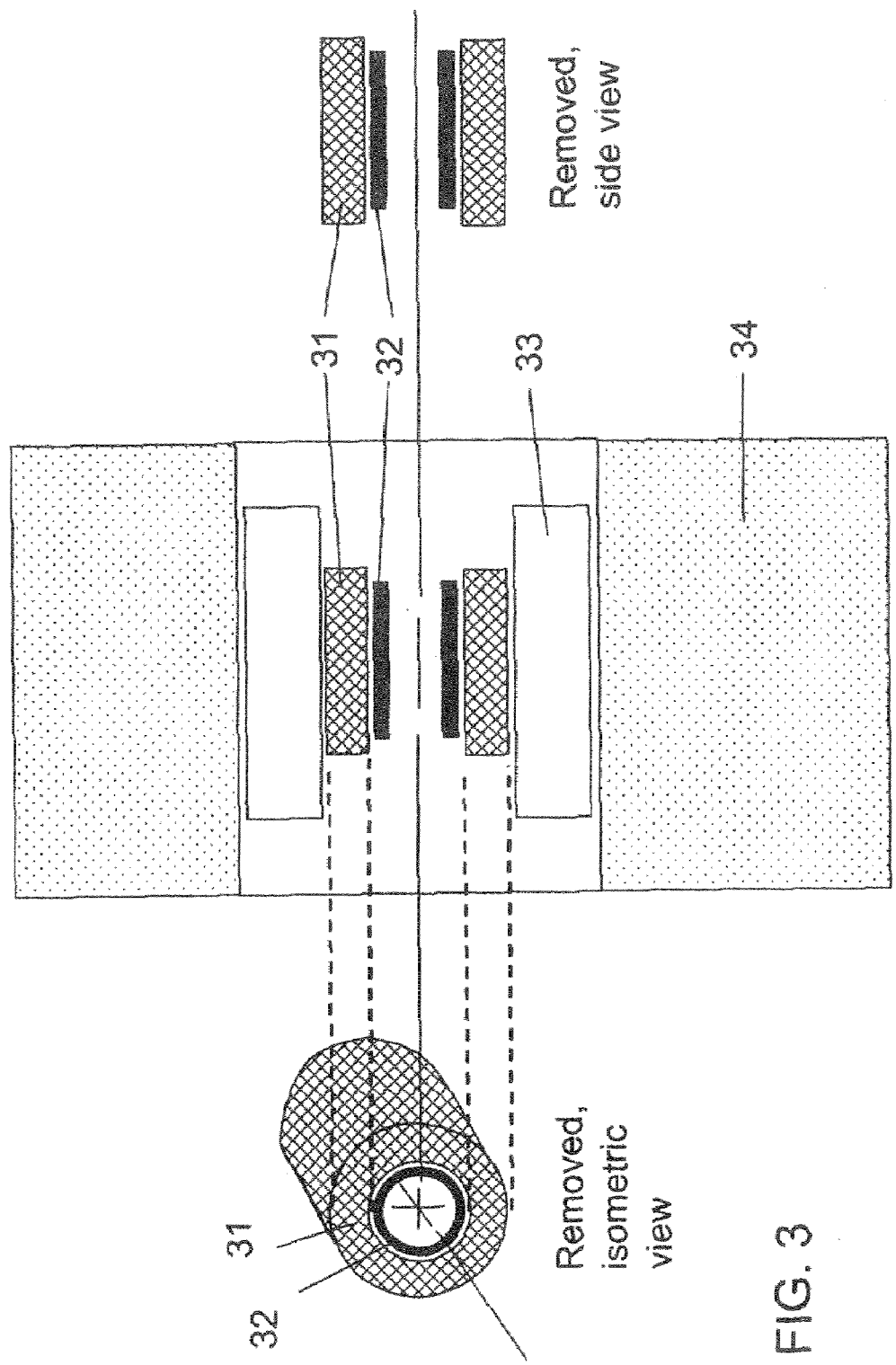
FIG. 3 illustrates yet another configuration of a combined magnetic resonance and single photon nuclear imaging system according to an embodiment of the present invention.

FIG. 3 depicts yet another configuration of a combined magnetic resonance and single photon nuclear imaging system according to an embodiment of the present invention. In FIG. 3, the imaging system includes a semiconductor detector 31 for detecting gamma photons and a collimator for single photon nuclear imaging of an object under study with the semiconductor detector 31. In addition, the imaging system includes a magnet 34 for producing a magnetic field suitable for magnetic resonance imaging and a transceiver 32 for magnetic resonance imaging of the object under study with the magnet 34. Here, the semiconductor detector 31 is configured to single photon nuclear image of the object under study under the magnetic field suitable for magnetic resonance imaging.

In more detail, the transceiver 32 is illustrated as an RF coil, the semiconductor detector 31 is illustrated as a CZT ring coupled to the RF coil via the collimator (described in more detail below), and a gradient coil 33 is shown to be attached to the magnet 34. Here, the collimator is attached to the RF coil and is used only in special cases when the particular RF coil is used. That is, the collimator is attached or is very close to the RF coil because the collimator is between the CZT ring (semiconductor detector) and the RF coil. As such, the CZT ring and/or the collimator is(are) removable like the RF coil (i.e., not semi-permanent). Here, like the embodiment of FIG. 2, the operation of the CZT and the MRI can be simultaneous or sequential, with simultaneous acquisition having certain advantages, as discussed in Wagenaar et al. "Rational for the Combination of Nuclear Medicine with Magnetic Resonance for Pre-clinical Imaging," Technology in Cancer Research and Treatment, ISSN 1533-0346, 2006, Vol. 5, No. 4, pp. 343-350, which is incorporated by reference herein in its entirety.

Figure 5:
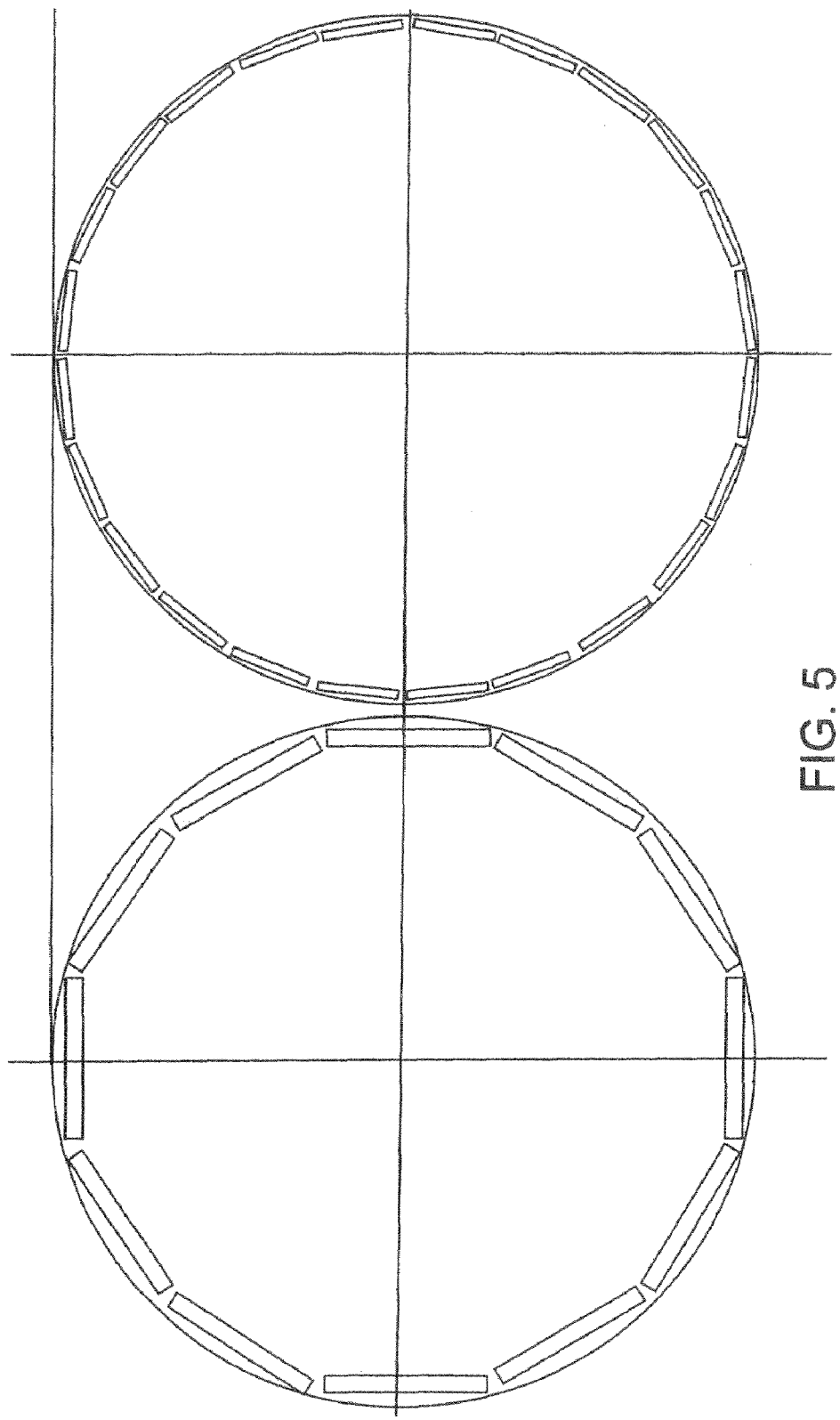

Referring to FIGS. 4 and 5, a semiconductor detector in accordance with an embodiment of the present invention is composed of a semiconductor detector ring, such as a CZT ring. The semiconductor ring, such as the CZT ring, includes a plurality of semiconductor linear sides (e.g., linear sides of CZT) M. In FIG. 4, semiconductor detector rings respectively having three (3), four (4), five (5), six (6), and eight (8) sides M are shown. In FIG. 5, semiconductor detector rings respectively having 12 and 24 sides M are shown. The present invention, however, is not limited to the side numbers shown in FIGS. 4 and 5. For example, the number of sides M can be any positive number ranging from 1 to 128.

Figure 6:
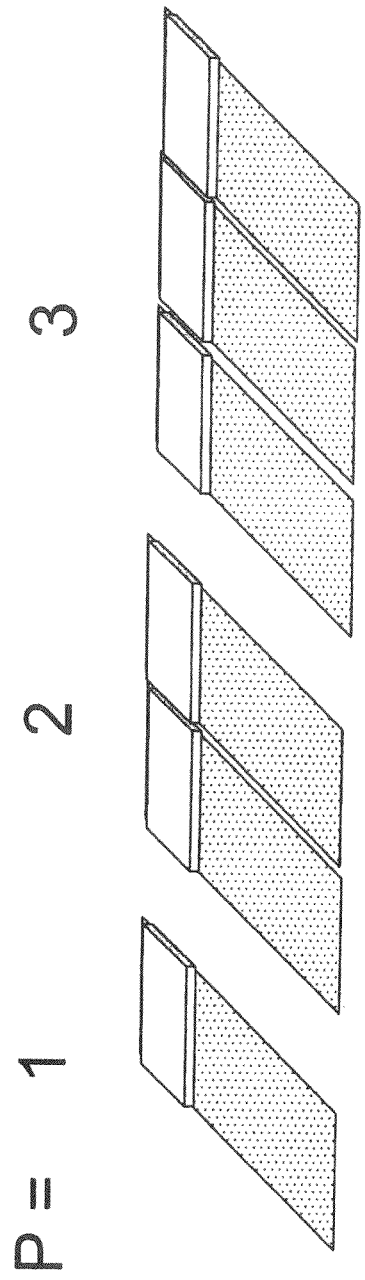
FIG. 6 illustrates semiconductor linear sides of the semiconductor detectors in accordance with embodiments of the present invention.

Referring now to FIG. 6, each of the semiconductor linear sides (or linear sides of CZT) M can have one or more individual semiconductor modules P. In FIG. 6, semiconductor linear sides M respectively having 1, 2, and 3 semiconductor modules P are shown.

Figure 7:
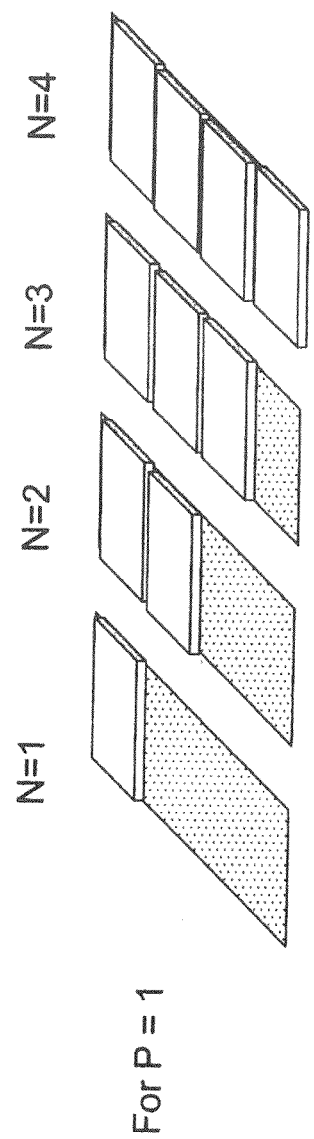
FIG. 7 illustrates a semiconductor detector composed of a number of semiconductor module rings in accordance with an embodiment of the present invention.

Also, referring to FIG. 7, a semiconductor detector in accordance with an embodiment of the present invention can also be composed of a number of semiconductor module rings, such as a number of CZT rings, N. In FIG. 7, a side of semiconductor detectors respectively having 1, 2, 3, and 4 rings N are shown. To put it another way, the semiconductor (or CZT) modules P are assembled on linear "ladders," linear in the sense that they are a line of semiconductor (or CZT) modules P as shown in FIG. 7. In FIG. 7, the numbers of semiconductor modules P in the ladders are respectively given as 1, 2, 3, and 4. In one embodiment, ladders such as shown in FIG. 7 with N=4 are typically arranged into a cylindrical "barrel" in high energy physics experimental set-ups, with the number of ladders "M" being the number of sides of the barrel detector surrounding the high energy physics experimental interaction volume.

Figure 8:
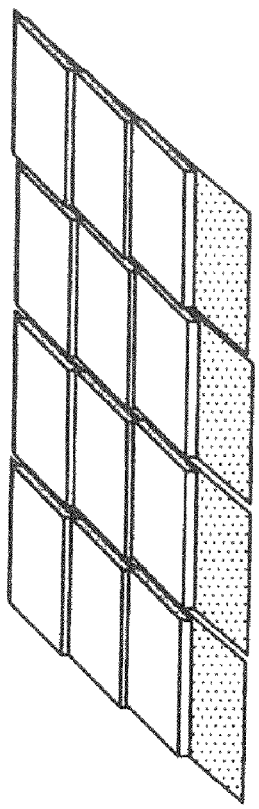
FIG. 8 illustrates a semiconductor linear side being a certain number of modules wide in accordance with an embodiment of the present invention.

Referring to FIG. 8, each of the semiconductor linear sides M can also be a certain number of modules P wide. In FIG. 8, a side M is shown to be 4 modules P wide and having 3 rings N.

Figure 9:
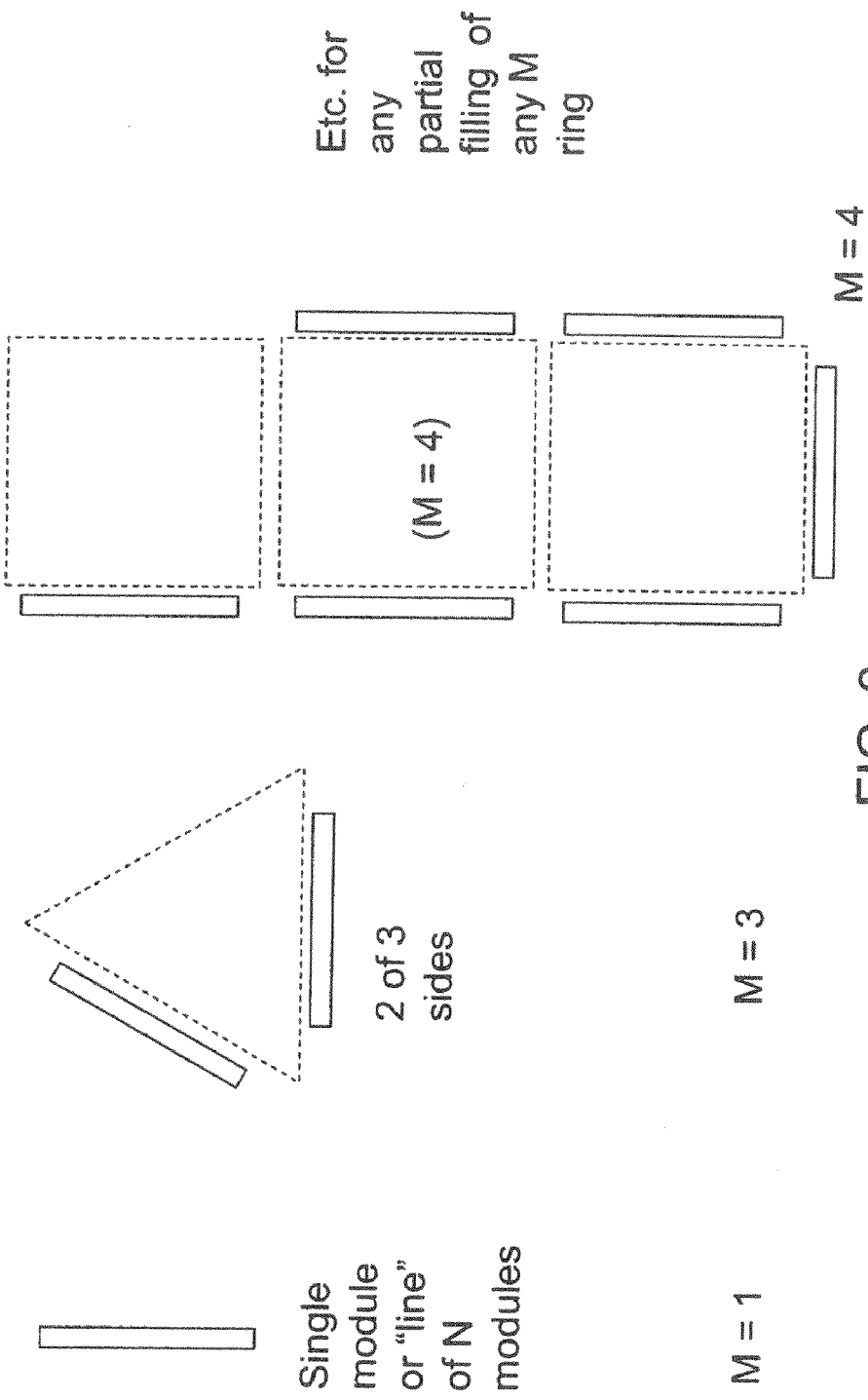
FIG. 9 illustrates a "coverage" of a semiconductor module ring that can be partial as shown in accordance with an embodiment of the present invention.

Referring to FIG. 9, the "coverage" of a semiconductor module ring (e.g., a semiconductor module ring N) can be complete, as shown in the sides M of the polygons of FIGS. 4 and 5, or partial as shown in FIG. 9. That is, a polygon having a plurality of sides M can be populated by CZTs in any number of sides from 1 to the total number of the sides M as shown in FIG. 9. However, it is noted that partial coverage of the polygon can result "limited angle tomography" in the field of nuclear medicine imaging. Limited angle tomography does not cover the complete range of angular sampling.

Figure 10:
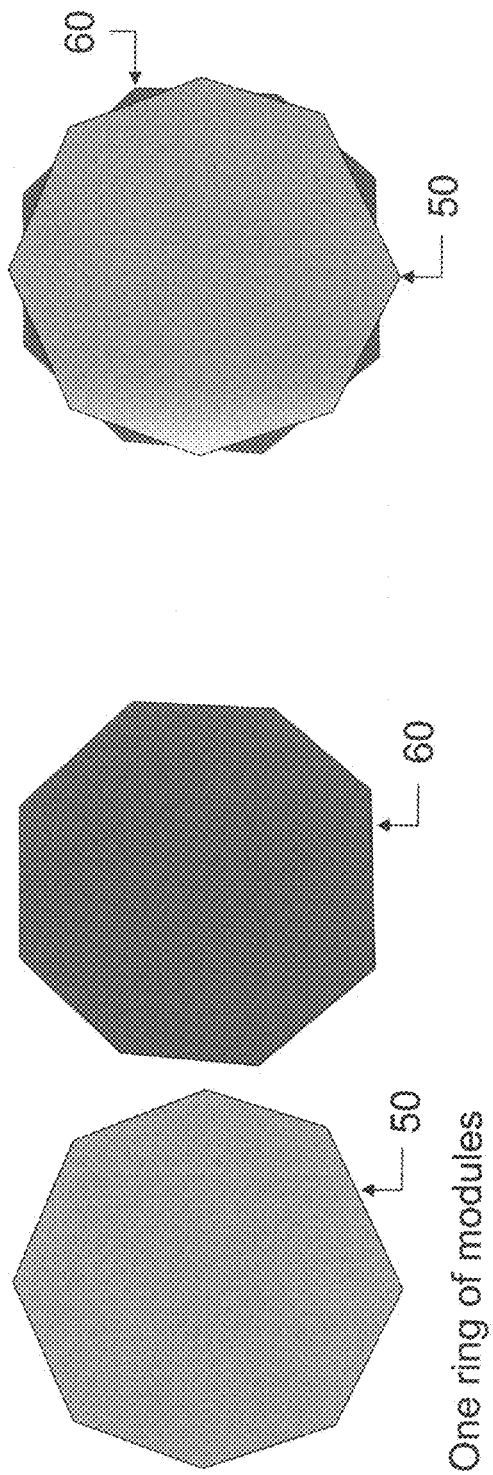
FIG. 10 illustrates an offset of a first semiconductor module ring and a second semiconductor module ring in accordance with an embodiment of the present invention.

Modules P (or sides M) of a first semiconductor module ring (or one ring of modules) can be aligned with modules P (or sides M) of a second semiconductor module ring (or a second ring of modules) along an axial direction as shown in FIGS. 7 and 8. Alternatively, as shown in FIG. 10, modules P (or sides M) of a first semiconductor module ring (or one ring of modules) 50 can have an angular offset with modules P (or sides M) of a second semiconductor module ring (or a second ring of modules) 60 along an axial direction. In FIG. 10, the offset of the first semiconductor module ring 50 and the second semiconductor module ring 60 allows these rings to view an object being imaged with twice the angular sampling with one axial motion. That is, as shown in FIG. 10, the object under study is single photon nuclear imaged by angular offsetting the modules P of the first modular ring 50 with the modules P of the second modular ring 60 along an axial direction so that these rings can view the object under study with twice the angular sampling.

An image formation apparatus, such as a collimator, is positioned between the object being imaged and a CZT ring. As an example, in nuclear medicine, this image formation apparatus can be either a parallel hole collimator or a pinhole collimator.

Figure 11:
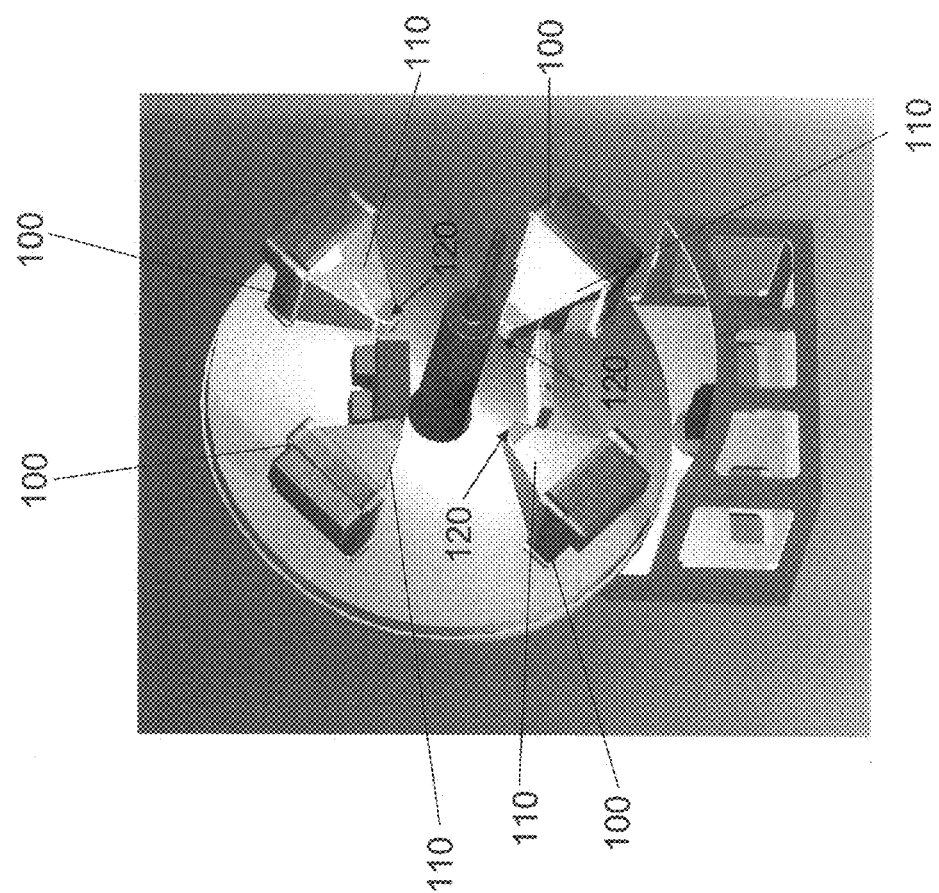
FIG. 11 illustrates a single photon nuclear imaging system pursuant to an embodiment of the present invention.

FIG. 11 depicts a single photon nuclear imaging system pursuant to an embodiment of the present invention. As shown in FIG. 11, the imaging system includes a four head detector (or detector heads) 100 with four pinhole collimators between the detector 100 and the object (e.g., a small animal) being imaged. Here, each of the four pinhole collimators includes a pinhole 120 and a pyramid-shaped cone 110 made of lead that suspend the pinhole 120 near the object being imaged. That is, the detector heads 100 are shielded from radiation by the pyramid-shaped cones 110 of lead that suspend the pinholes 120 near the object being imaged to single photon nuclear image the object being imaged with the detector heads 100. The present invention, however, is not limited to an imaging formation apparatus having one or more pinholes (or a pinhole collimator). That is, an image formation device can be composed of a single pinhole per CZT module, a single pinhole per CZT side (illuminating all rings), multiple pinholes per CZT side (illuminating all rings), a single slit per CZT side per ring, multiple slits illuminating a CZT side (all rings), slits that are either parallel to the axis of the MR field or tangentially oriented, a coded aperture array of holes that is formed in the cylinder or suspended between the object being imaged and the CZT side (all rings), a cylindrical coded aperture array, also known as a "ring coded aperture" that is positioned between the object being imaged and the CZT side (all rings), an array of stationary holes that is positioned between the object being imaged and the CZT ring (i.e., a collimator, either parallel hole or converging), and/or an array of stationary attenuating pins that is positioned between the object being imaged and the CZT ring (i.e., an inverse collimator with either parallel pins or converging pins).

Also, in one embodiment of the present invention, the object under study is single photon nuclear imaged by not moving the semiconductor detector. That is, the image formation device (e.g., the collimator) can be completely stationary (i.e., non-moving) and its orientation relative to the CZT ring fixed. For example, the "coverage" of a semiconductor module ring (e.g., a semiconductor module ring N or detector heads) can completely surround an object being imaged so that the image formation device does not have to rotate (i.e., can be stationary) to view the complete (or entire) object as, e.g., shown in FIGS. 4 and 5. Further, a stationary detector can also overcome any eddy currents (or noises or distortions) that may be produced by a detector that rotates in a magnetic field. However, the present invention is not thereby limited and, alternatively, the image formation device (e.g., the collimator) can be composed of a cylinder that can rotate.

Moreover, in one embodiment of the present invention, the image formation material (e.g., lead) of the image formation device should be highly absorbent of x-rays and gamma-rays but still minimally disturbing of the magnetic field. The rotating cylinder should be centered on the axis of the magnetic field, and the spatial distribution of mass should substantially remain unchanged during rotation, such that the magnetic field is minimally perturbed by the rotational movement.

Figure 12:
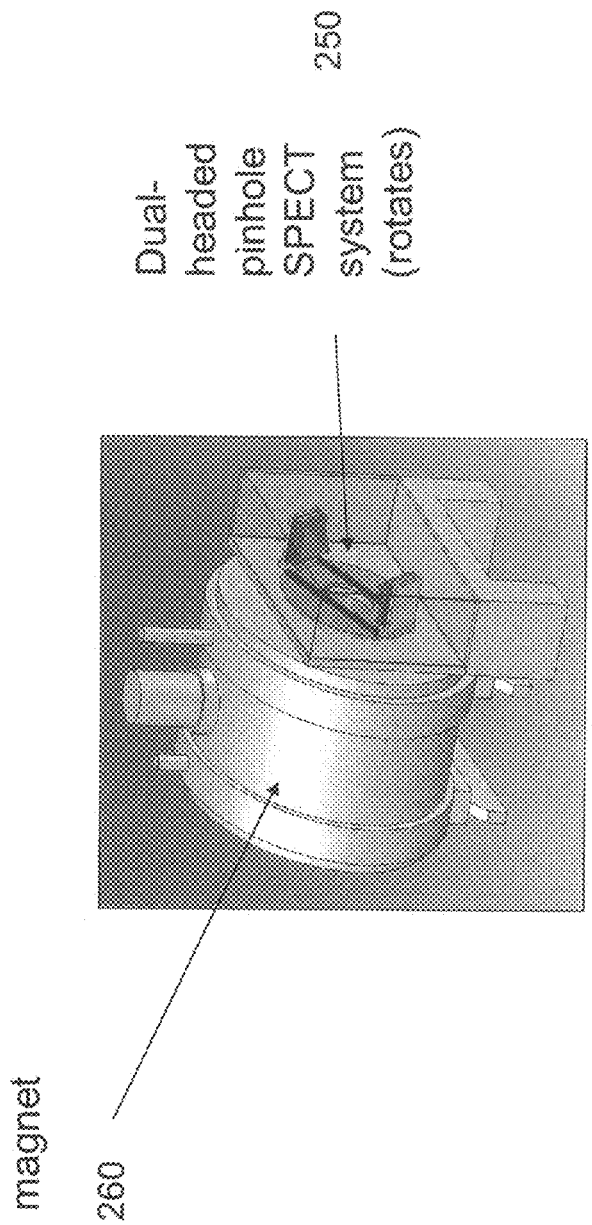
FIG. 12 illustrates a configuration of a combined magnetic resonance and single photon nuclear imaging system in accordance with an embodiment of the present invention.

FIG. 12 depicts a configuration of a combined magnetic resonance and single photon nuclear imaging system according to an embodiment of the present invention. In more detail, FIG. 12 depicts an external dual-head pinhole MR-SPECT configuration or "adjacent" configuration in which a dual-headed pinhole SPECT system 250 is attached external to (or to the outside surface of) a magnet 260 of an MRI system. The patient (or animal) is sequentially imaged, by the pinhole SPECT system 250 first and then magnetic resonance imaged by the magnet 260, or vice-versa, with the patient (or animal) on the same bed in the same axial position. Here, the one or more detectors (or detector heads) of dual-headed pinhole SPECT system 250 can rotate.

Figure 13:
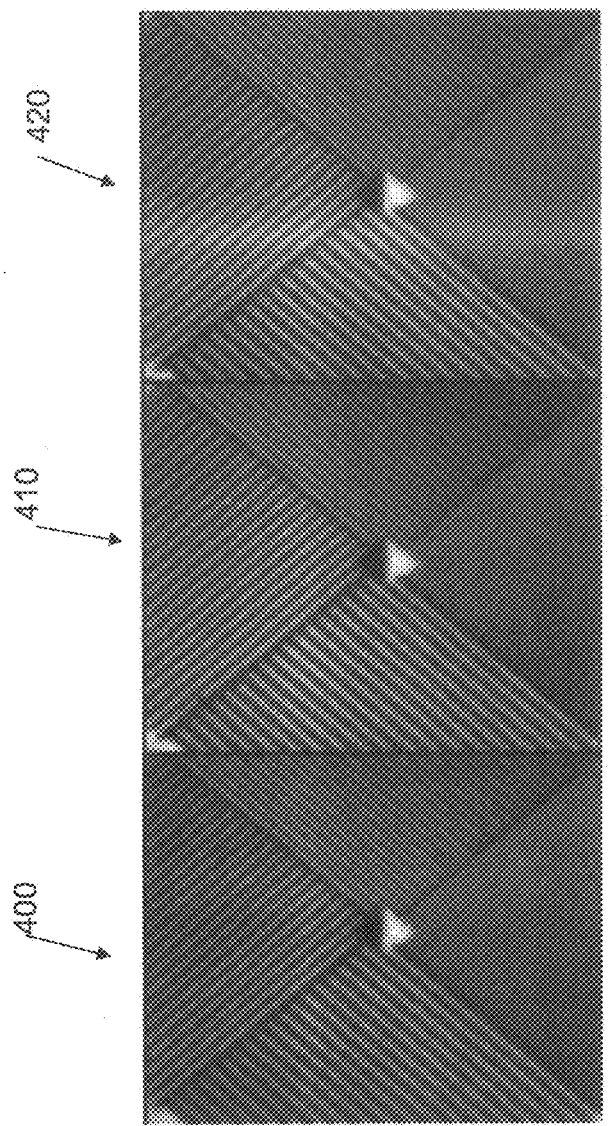
FIG. 13 shows gamma-ray images of a line phantom taken with a CZT camera. The image at the left was acquired in the earth's magnetic field (~50 µT). The image in the center was at 5.0 mT. The image at the right was at 10.0 mT (200 times earth's field). No magnetic field-related distortions were observed with the semiconductor CZT.

FIG. 13 shows gamma-ray images 400, 410, and 420 of a line phantom taken with a CZT camera. The image 400 was taken in the Earth field. The image 410 was taken at the location where the field was 50 Gauss. The image 420 was taken at the location where the field was 100 Gauss. Here, the line phantom has line spaces of 3.5 mm in the left section, top section 3 mm, right section 2.5 mm, and bottom section 2 mm. The pixel size of the gamma camera was 2.5 mm. Field direction was pointing from top to bottom.

Figure 14:
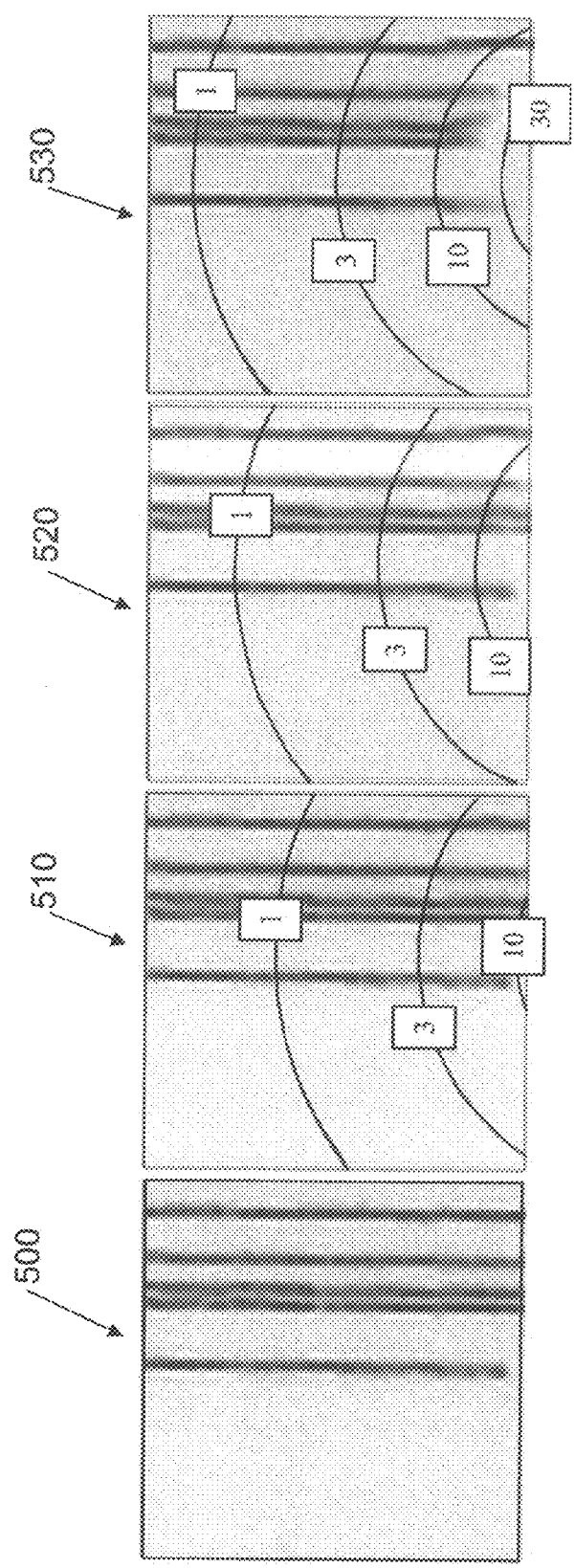
FIG. 14 shows images of five capillary tubes filled with 99 mTc solutions in the magnetic field, taken with a PSPMT gamma camera. Lines of constant magnetic field strength are labeled in units of Gauss ($10^{-4}$ T). The PSPMT fails to produce an image at 30 Gauss (3 mT).

By contrast, FIG. 14 shows images 500, 510, 520, and 530 of five capillary tubes filled with 99 mTc solutions in the magnetic field, taken with a PSPMT gamma camera. Data in the 99 mTc peak were used to construct the images. The tube inner diameter was 0.5 mm, and image sizes are 12.5×12.5 cm$^2$. The image 500 was taken in the Earth field, and the images 510, 520, and 530 were taken with a magnet 6 cm, 4.5 cm, and 3 cm from the lower edge, respectively. In images 510, 520, and 530 contour lines show field levels in Gauss.

As such, the images of FIGS. 13 and 14 show the CZT camera to be insensitive to magnetic fields up to 100 G (FIG. 13), whereas the PMT-based system failed at about 15 G or 1.5 mT (FIG. 14).

FIG. 15 demonstrates the complementary relationship between MRI and nuclear imaging, such as SPECT. In particular, when the two modalities are combined according to an embodiment of the present invention, the embodiment can realize complete coverage of the space between high resolution, anatomical imaging, and genetically targeted molecular imaging.

Figure 16:
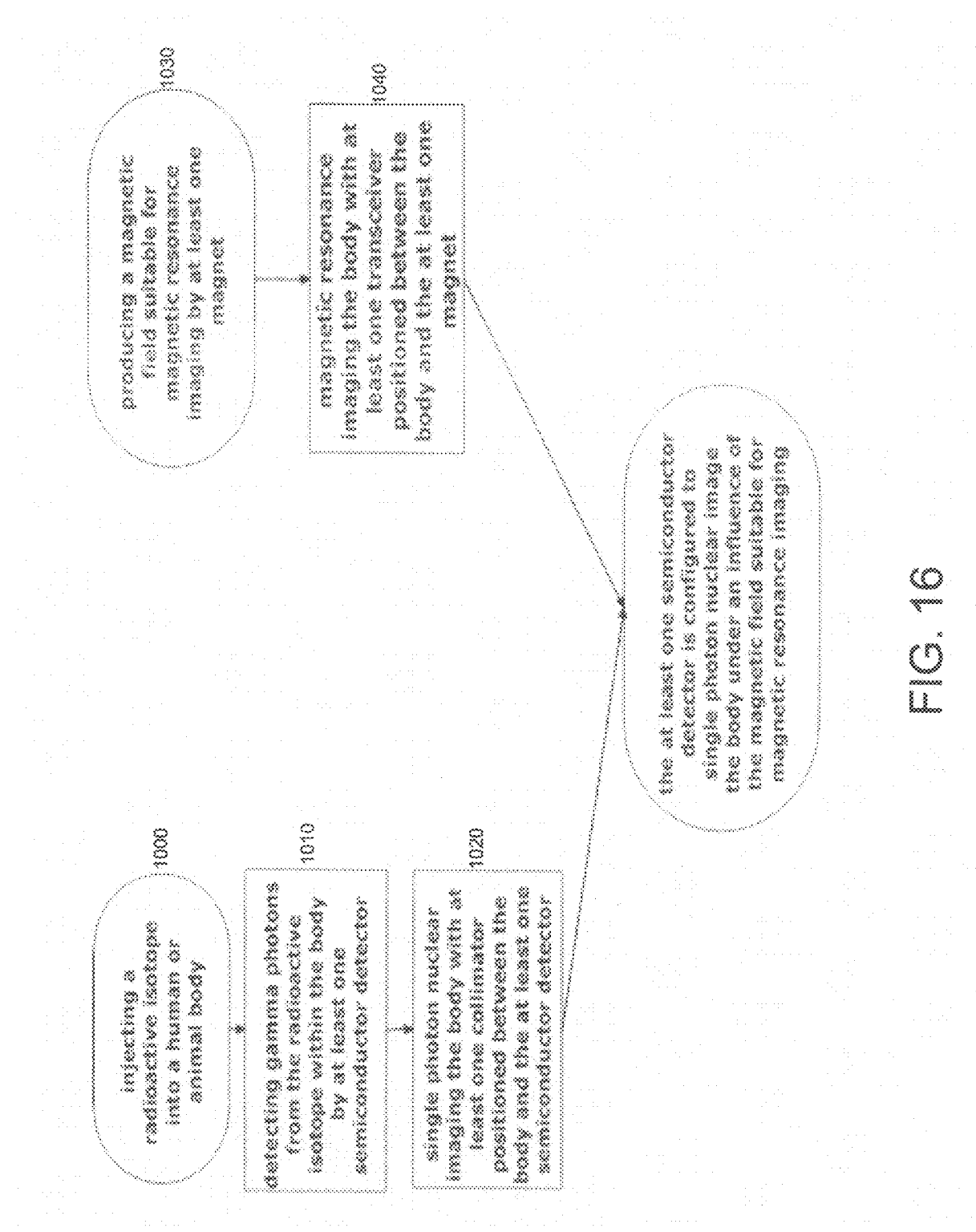
FIG. 16 illustrates a method of combining magnetic resonance and single photon nuclear imaging in accordance with an embodiment of the present invention.

FIG. 16 illustrates a method of combining magnetic resonance and single photon nuclear imaging in accordance with an embodiment of the present invention. In step 1000 of this embodiment, a radioactive isotope is injected into an object under study. Gamma photons from the radioactive isotope within the object under study are detected by at least one semiconductor detector in step 1010.

In step 1020, the object under study is single photon nuclear imaged with at least one collimator positioned between the object under study and the at least one semiconductor detector. In one embodiment of the present invention, the object under study is single photon nuclear imaged by not moving the at least one semiconductor detector. Also, in one embodiment, the at least one semiconductor detector includes a first modular ring and a second modular ring, and the object under study is single photon nuclear imaged by angular offsetting the modules of the first modular ring with the modules of the second modular ring along an axial direction so that these rings can view the object under study with twice the angular sampling with one axial motion.

Moreover, simultaneously, concurrently, or sequentially with the above steps 1000, 1010, and 1020, a magnetic field suitable for magnetic resonance imaging is produced by at least one magnet in step 1030, and the object under study is magnetic resonance imaged with at least one transceiver positioned between the object under study and the at least one magnet in step 1040. Here, in the method of FIG. 16, the object under study is single photon nuclear imaged under an influence of the magnetic field suitable for magnetic resonance imaging.

Figure 17:
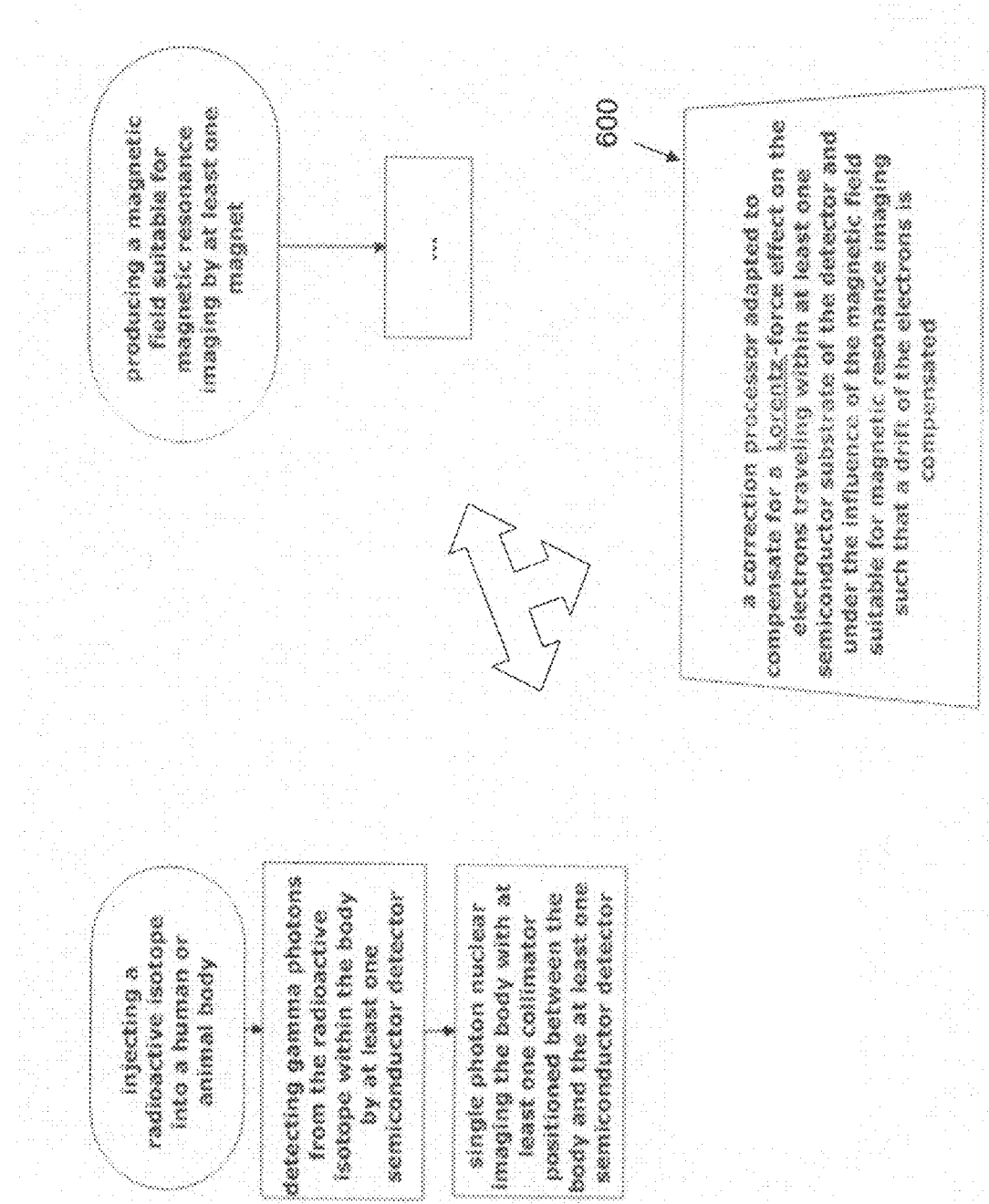
FIG. 17 illustrates a correction processor provided to one or more semiconductor detectors in accordance with an embodiment of the present invention.

In one embodiment, and referring to FIG. 17, a correction processor 600 is provided to the at least one semiconductor detector (or detectors). Here, the semiconductor detector has at least one semiconductor substrate (or substrates) for producing electrons upon an interaction with gamma photons, and the correction processor 600 is adapted to compensate for a Lorentz-force effect on the electrons traveling within the at least one semiconductor substrate and under the influence of the magnetic field suitable for magnetic resonance imaging such that a drift of the electrons is compensated.

Figure 18:
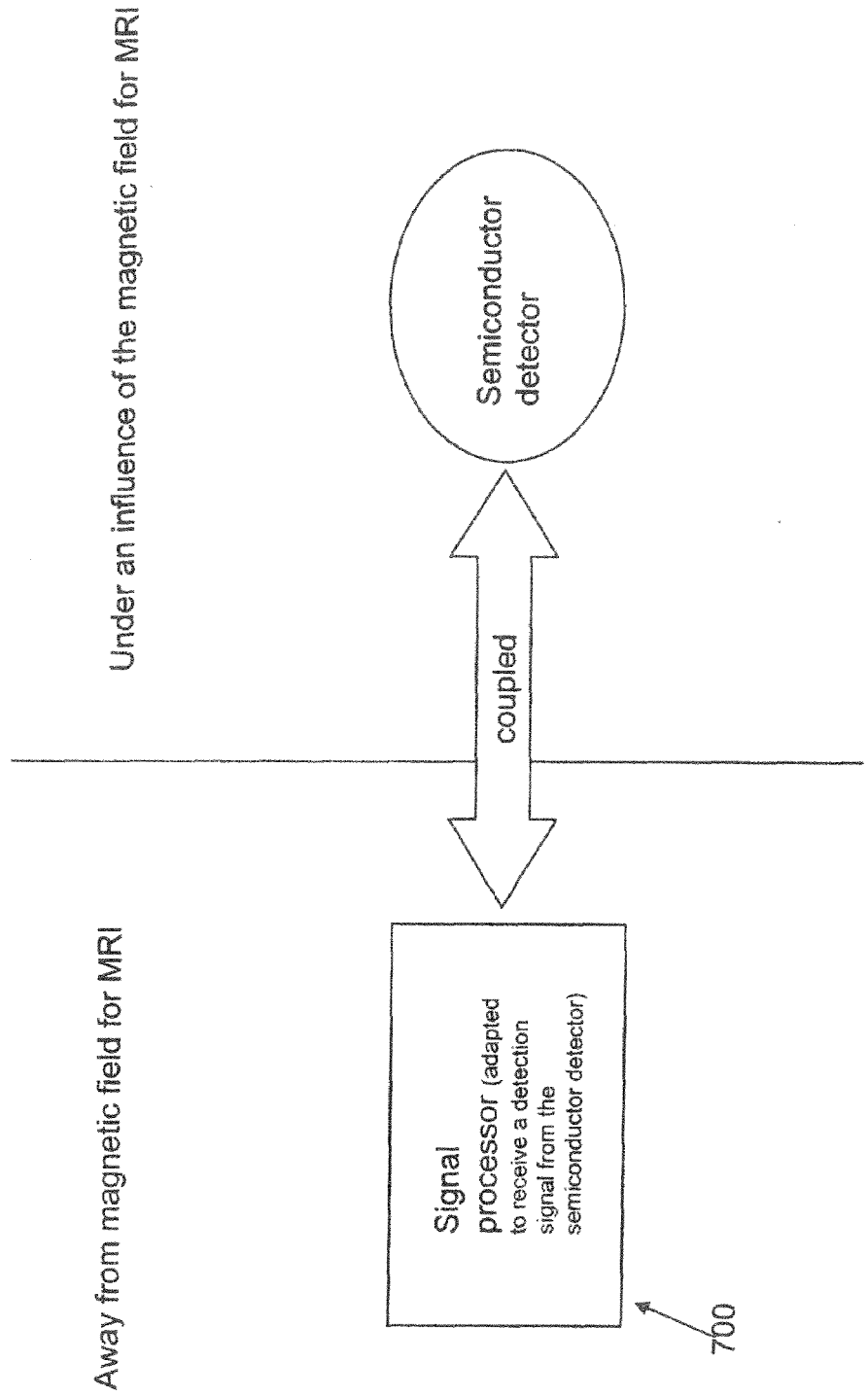
FIG. 18 illustrates a semiconductor detector according to one embodiment of the present invention that is adapted to detect gamma photon(s) outputted by an object under study and to generate a direct detection signal in response.

Referring to FIG. 18, the at least one semiconductor detector (or detectors) according to one embodiment of the present invention is adapted to detect one or more gamma photons emitted by the object under study and to generate a direct detection signal in response. In this embodiment, a signal processor 700 is coupled to the at least one semiconductor detector and adapted to receive the detection signal. The signal processor 700 includes a plurality of electronics adapted to amplify, address, and process the detection signal, and the signal processor 700 is shown in FIG. 18 to be positioned away from the magnetic field suitable for magnetic resonance imaging to remove an interference effect of the magnetic field suitable for magnetic resonance imaging.

It should be appreciated from the above that the various structures and functions described herein may be incorporated into a variety of apparatuses (e.g., an imaging device, a monitoring device, etc.) and implemented in a variety of ways. Different embodiments of the imaging and/or monitoring devices may include a variety of hardware and software processing components. In some embodiments, hardware components such as processors, controllers, state machines and/or logic may be used to implement the described components or circuits. In some embodiments, code such as software or firmware executing on one or more processing devices may be used to implement one or more of the described operations or components.

In view of the foregoing, some embodiments of the invention described herein generally relate to an apparatus and method for providing a dual-modality, fused image dataset from MRI and single-photon nuclear medicine imaging modalities in a single imaging session. The single imaging session allows an object (e.g., a human or animal body or a body part or an entire laboratory animal or specimen from the animal or a plastic test phantom) being scanned to remain motionless for sequential scanning while using the same body position on the same bed, thereby minimizing mis-registration artifacts from changes in body orientation between imaging studies. The single session also allows the simultaneous operation of the two modalities, providing exact co-registration in position as well as in time. The ability to perform fused dual-modality imaging is helpful in both clinical imaging as well as pre-clinical research studies involving laboratory humans or animals for the development of drugs and therapies or the general study of biological processes.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A combined magnetic resonance and single photon nuclear imaging system, the system comprising:
   at least one compound semiconductor detector configured to directly convert incident gamma photons into electron-hole charge carriers;
   at least one collimator for single photon nuclear imaging an object under study with the at least one compound semiconductor detector;
   at least one magnet for producing a magnetic field suitable for magnetic resonance imaging, the at least one magnet having a central opening;
   at least one transceiver for magnetic resonance imaging the object under study with the at least one magnet; and
   a correction processor,
   wherein the at least one compound semiconductor detector is configured to single photon nuclear image the object under study under the magnetic field suitable for magnetic resonance imaging,
   wherein the at least one compound semiconductor detector is configured to single photon nuclear image the object under study at either end of the at least one magnet and outside the central opening of the at least one magnet such that the object under study is single photon nuclear imaged and magnet resonance imaged in a sequential manner,
   wherein the at least one compound semiconductor detector is adjacent and attached to the outside surface of the at least one magnet,
   wherein the correction processor is configured to compensate for an effect on the charge carriers traveling within the at least one compound semiconductor detector and under the magnetic field suitable for magnetic resonance imaging,
   wherein the at least one semiconductor detector comprises a first ring having a plurality of first modules and a second ring having a plurality of second modules, and wherein the first modules of the first ring are aligned to have an angular offset with the second modules of the second ring along an axial direction to view the object under study with twice the angular sampling with one axial motion.

2. The system of claim 1, wherein the at least one compound semiconductor detector comprises a material selected from the group consisting of cadmium telluride (CdTe), mercuric iodide (HgI2), thallium bromide (TlBr), gallium arsenide (GaAs), cadmium zinc telluride (CdZnTe), and cadmium manganese telluride (CdMnTe).

3. The system of claim 1, wherein the at least one compound semiconductor detector is a cadmium zinc telluride (CZT) detector.

4. The system of claim 1, wherein the at least one compound semiconductor detector comprises:
   at least one compound semiconductor substrate for producing the charge carriers through interaction with the gamma photons; and
   a plurality of electrodes for collecting the charge carriers.

5. The system of claim 1, wherein the at least one collimator is configured to be positioned between the object under study and the at least one compound semiconductor detector.

6. The system of claim 1, wherein the at least one compound semiconductor detector is a stationary detector.

7. The system of claim 1, wherein the effect on the charge carriers configured to be compensated by the correction processor is a Lorentz-force effect.

8. The system of claim 1, further comprising a signal processor configured to process the charge carriers as a detection signal and comprising a plurality of electronics adapted to amplify, address, and process the detection signal,
   wherein the signal processor is positioned away from the magnetic field suitable for magnetic resonance imaging to remove an interference effect of the magnetic field suitable for magnetic resonance imaging.

9. A method of combining magnetic resonance and single photon nuclear imaging, the method comprising:
   injecting a radioactive isotope into an object under study;
   directly converting gamma photons from the radioactive isotope within the object under study by at least one semiconductor detector into electron-hole charge carriers;
   single photon nuclear imaging the object under study with at least one collimator positioned between the object under study and the at least one semiconductor detector;
   producing a magnetic field suitable for magnetic resonance imaging by at least one magnet;
   magnetic resonance imaging the object under study with at least one transceiver positioned between the object under study and the at least one magnet; and
   correcting for an effect on the charge carriers traveling within the at least one compound semiconductor detector and under the magnetic field suitable for magnetic resonance imaging
   wherein the object under study is single photon nuclear imaged under the magnetic field suitable for magnetic resonance imaging,
   wherein the at least one semiconductor detector is at least one compound semiconductor detector,
   wherein the at least one magnet comprises a central opening,
   wherein the object under study is single photon nuclear imaged by the at least one semiconductor at either end of the at least one magnet and outside the central opening of the at least one magnet such that the object under study is single photon nuclear imaged and magnet resonance imaged in a sequential manner, wherein the at least one compound semiconductor detector is adjacent and attached to the outside surface of the at least one magnet, wherein the at least one semiconductor detector comprises a first ring having a plurality of first modules and a second ring having a plurality of second modules, and wherein the first modules of the first ring are aligned to have an angular offset with the second modules of the second ring along an axial direction to view the object under study with twice the angular sampling with one axial motion.

10. The method of claim 9, the detecting of the gamma photons comprising:
interacting the gamma photons with at least one compound semiconductor substrate of the at least one compound semiconductor detector; and
collecting charge carriers produced by the interaction of the gamma photons with the at least one compound semiconductor substrate.

11. The method of claim 9, wherein the correcting for the effect on the charge carriers comprises correcting for a Lorentz-force effect on the charge carriers traveling within the at least one compound semiconductor detector and under the magnetic field suitable for magnetic resonance imaging.

12. The method of claim 9, further comprising:
generating at least one direct detection signal in response to detecting the gamma photons by the at least one compound semiconductor detector;
receiving the detection signal by a signal processor comprising a plurality of electronics adapted to amplify, address, and process the detection signal; and
removing an interference effect of the magnetic field suitable for magnetic resonance imaging on the single photon nuclear imaging by positioning the signal processor away from the magnetic field suitable for magnetic resonance imaging.

13. A combined magnetic resonance and single photon nuclear imaging system, the system comprising:
at least one compound semiconductor detector configured to directly convert incident gamma photons into electron-hole charge carriers;
at least one collimator for single photon nuclear imaging an object under study with the at least one compound semiconductor detector;
at least one magnet for producing a magnetic field suitable for magnetic resonance imaging; and
at least one transceiver for magnetic resonance imaging the object under study with the at least one magnet,
wherein the at least one compound semiconductor detector is configured to single photon nuclear image the object under study under the magnetic field suitable for magnetic resonance imaging,
wherein the at least one compound semiconductor detector is adjacent and attached to the outside surface of the at least one magnet,
wherein the at least one semiconductor detector comprises a first ring having a plurality of first modules and a second ring having a plurality of second modules, and wherein the first modules of the first ring are aligned to have an angular offset with the second modules of the second ring along an axial direction to view the object under study with twice the angular sampling with one axial motion.

14. The system of claim 13, wherein the at least one compound semiconductor detector comprises a material selected from the group consisting of cadmium telluride (CdTe), mercuric iodide (HgI2), thallium bromide (TlBr), gallium arsenide (GaAs), cadmium zinc telluride (CdZnTe), and cadmium manganese telluride (CdMnTe).

15. The system of claim 13, wherein the at least one compound semiconductor detector is a cadmium zinc telluride (CZT) detector.

16. The system of claim 13, wherein the at least one compound semiconductor detector comprises:
at least one compound semiconductor substrate for producing the charge carriers through interaction with the gamma photons; and
a plurality of electrodes for collecting the charge carriers.

17. The system of claim 13, wherein the at least one collimator is configured to be positioned between the object under study and the at least one compound semiconductor detector.

18. The system of claim 13, wherein the at least one compound semiconductor detector is a stationary detector.

19. A method of combining magnetic resonance and single photon nuclear imaging an object under study injected with a radioactive isotope, the method comprising:
directly converting gamma photons from the radioactive isotope within the object under study by at least one compound semiconductor detector into electron-hole charge carriers;
single photon nuclear imaging the object under study with at least one collimator positioned between the object under study and the at least one compound semiconductor detector;
producing a magnetic field suitable for magnetic resonance imaging by at least one magnet; and
magnetic resonance imaging the object under study with at least one transceiver positioned between the object under study and the at least one magnet,
wherein the object under study is single photon nuclear imaged under the magnetic field suitable for magnetic resonance imaging,
wherein the at least one compound semiconductor detector is adjacent and attached to the outside surface of the at least one magnet,
wherein the at least one semiconductor detector comprises a first ring having a plurality of first modules and a second ring having a plurality of second modules, and wherein the first modules of the first ring are aligned to have an angular offset with the second modules of the second ring along an axial direction to view the object under study with twice the angular sampling with one axial motion.

* * * * *

UNITED STATES PATENT AND TRADEMARK OFFICE
CERTIFICATE OF CORRECTION

| | | |
|---|---|---|
| PATENT NO. | : 8,071,950 B2 | Page 1 of 1 |
| APPLICATION NO. | : 12/592364 | |
| DATED | : December 6, 2011 | |
| INVENTOR(S) | : Douglas J. Wagenaar et al. | |

It is certified that error appears in the above-identified patent and that said Letters Patent is hereby corrected as shown below:

In the Claims

Column 14, Claim 9, line 51        Delete "compound"

Signed and Sealed this
Twenty-ninth Day of May, 2012

David J. Kappos
*Director of the United States Patent and Trademark Office*